(12) United States Patent
Sakurai et al.

(10) Patent No.: US 8,575,751 B2
(45) Date of Patent: Nov. 5, 2013

(54) CONDUCTIVE BUMP, METHOD FOR PRODUCING THE SAME, AND ELECTRONIC COMPONENT MOUNTED STRUCTURE

(75) Inventors: Daisuke Sakurai, Osaka (JP); Yoshihiko Yagi, Kanagawa (JP)

(73) Assignee: Panasonic Corporation, Osaka (JP)

( * ) Notice: Subject to any disclaimer, the term of this patent is extended or adjusted under 35 U.S.C. 154(b) by 466 days.

(21) Appl. No.: 12/522,239

(22) PCT Filed: Mar. 4, 2008

(86) PCT No.: PCT/JP2008/000428
§ 371 (c)(1),
(2), (4) Date: Jul. 6, 2009

(87) PCT Pub. No.: WO2008/117513
PCT Pub. Date: Oct. 2, 2008

(65) Prior Publication Data
US 2009/0315178 A1    Dec. 24, 2009

(30) Foreign Application Priority Data

Mar. 23, 2007  (JP) .................................. 2007-076317

(51) Int. Cl.
*H01L 23/48* (2006.01)
*H01L 23/52* (2006.01)

(52) U.S. Cl.
USPC ........... 257/750; 257/737; 257/748; 257/781; 257/741; 257/E23.017

(58) Field of Classification Search
USPC ............ 257/737, 738, 781, E23.01, E23.033, 257/666, 673, 734, 739, 741, 746, 748, 750, 257/753, 773, 780, E23.001, E23.017, 257/E23.018, E23.02, E23.021
See application file for complete search history.

(56) References Cited

U.S. PATENT DOCUMENTS

| 5,508,561 | A | * | 4/1996 | Tago et al. | ..................... 257/737 |
| 7,524,748 | B2 | | 4/2009 | Fujimoto et al. | |
| 7,608,784 | B2 | * | 10/2009 | Sato | ............................ 174/94 R |
| 7,618,711 | B2 | * | 11/2009 | Nakanishi et al. | ............ 428/418 |
| 2004/0108133 | A1 | | 6/2004 | Sano et al. | |
| 2006/0113681 | A1 | * | 6/2006 | Jeong et al. | .................... 257/780 |
| 2007/0132098 | A1 | * | 6/2007 | Sano et al. | ..................... 257/737 |

FOREIGN PATENT DOCUMENTS

| JP | 05-326524 | 12/1993 |
| JP | 07-074459 | 3/1995 |
| JP | 2000-332055 | 11/2000 |
| JP | 2001-189337 | 7/2001 |
| JP | 2004-022623 | 1/2004 |
| JP | 2004-051755 | 2/2004 |
| JP | 2004-260131 | 9/2004 |
| JP | 2007-250618 | 9/2007 |

OTHER PUBLICATIONS

Ishigure et al. Electrical and elastic properties of conductor-poluymer composites. Journal of Material Science, 34 (1999), pp. 2979-2986.*
Korean Office Action issued in Korean Patent Application No. KR 10-2009-7015956 dated Feb. 11, 2011.

* cited by examiner

*Primary Examiner* — Cuong Q Nguyen
*Assistant Examiner* — Galina Yushina
(74) *Attorney, Agent, or Firm* — McDermott Will & Emery LLP (57) ABSTRACT

A conductive bump formed on an electrode surface of an electronic component. This conductive bump is composed of a plurality of photosensitive resin layers having different conductive filler contents. Consequently, this conductive bump is able to realize conflicting functions, namely, improvement in adhesion strength with the electrode and reduction of contact resistance.

9 Claims, 10 Drawing Sheets

CONDUCTIVE BUMP, METHOD FOR PRODUCING THE SAME, AND ELECTRONIC COMPONENT MOUNTED STRUCTURE

RELATED APPLICATIONS

This application is the U.S. National Phase under 35 U.S.C. §371 of International Application No. PCT/JP2008/000428, filed on Mar. 4, 2008, which in turn claims the benefit of Japanese Application No. 2007-076317, filed on Mar. 23, 2007, the disclosures of which Applications are incorporated by reference herein.

TECHNICAL FIELD

The present invention relates to a conductive bump formed on an electrode terminal of a semiconductor element or a connection terminal of a circuit board. More particularly, the present invention relates to a conductive bump allowing narrow-pitched semiconductor elements to be reliably mounted on connection terminals of a circuit board, a method for producing the conductive bump, and an electronic component mounted structure.

BACKGROUND ART

Recently, in mobile electronic devices such as portable telephones, notebook-sized personal computers, PDAs and digital video cameras, technology development for realizing small-size, light-weight and high-performance devices has been rapidly advanced.

One principle electronic component for supporting this technology development is a semiconductor element. Thinner and higher-density semiconductor element, that is, finer wiring rule and increased pins of an electrode terminal have been remarkably developed. Accordingly, an insulating layer of a semiconductor element has been strictly demanded to have a low dielectric constant (Low-k). Therefore, the insulating layer has been replaced with a porous layer of, for example, p—SiOC and an organic polymer. Under such circumstances, strict requirements have been made with respect to a bump used in flip-chip mounting a semiconductor element on a mounting board.

Conventionally, a technology for mounting electronic components such as a semiconductor element on various wiring boards with a high density includes a flip-chip mounting technology. In usual flip-chip mounting, a metal bump having, for example, a diameter of about 150 μm and made of solder, gold, or the like, is previously formed on an electrode terminal formed on a semiconductor element such as LSI. Then, the semiconductor element is subjected to pressure contact and heating, and bump-connected to and mounted on a connection terminal of a mounted board by face-down bonding.

In particular, in order to correspond to remarkably increased pins, a bump is formed by using an entire surface of a semiconductor element on which a circuit is formed. This bump forming method is called an area bump method. In this method, since it is necessary to follow warp on the entire mounting area of the circuit board at the time of mounting, a bump having a high aspect ratio is demanded. For example, when a next generation LSI having more than 5000 electrode terminals is mounted on a circuit board, it is necessary to form a bump corresponding to a narrow pitch of not more than 100 μm and having a high aspect ratio. However, it is difficult for current solder-bump formation technologies to meet such requirements. Conventionally, a plating method, a screen printing method, and the like, are employed as a bump formation technology. However, although the plating method is suitable for forming bumps with a narrow pitch, the process is complicated and the productivity is low. Meanwhile, although the screen printing method is excellent in productivity, use of a mask makes it difficult to satisfy both a narrow pitch and a high aspect ratio.

Furthermore, in the area bump method, a weak dielectric material, a transistor, and the like, are disposed immediately beneath an electrode terminal of a semiconductor element. However, in a technology in which mounting is carried out by using a metal bump, a pressurizing force is necessary at the time of press contact, and a large load is applied to a portion beneath the electrode terminal of the semiconductor element. Therefore, in a semiconductor element including a porous and weak insulating layer, destruction of the insulating layer, element cracking, and fluctuation of the element property of the semiconductor element may occur.

In such circumstances, some technologies for selectively forming solder bumps on electrode terminals of an LSI chip or connection terminals of a circuit board have been proposed recently. These technologies are suitable for forming fine bumps. Furthermore, they are capable of forming bumps collectively, so that a high productivity can be achieved. These technologies have been receiving much attention as a mounting technology for a circuit board of next generation LSI.

As one of the above-mentioned technologies, a method for forming bumps selectively on a connection terminal by immersing a circuit board having electrode terminals on the surface thereof in a chemicals so as to form an adhesive film only on the surface of the connection terminals, adhesively attaching solder powder to the adhesive film, and then heating and melting thereof has been disclosed (see, for example, patent document 1).

However, such technologies show a method for forming a bump on an electrode terminal of a semiconductor element or on a connection terminal of a circuit board. That is to say, the usual flip chip mounting needs a process of forming a bump, then mounting a semiconductor element on the circuit board, bonding a connection terminal and an electrode terminal to each other by solder reflow via the bump, and a process of fixing the semiconductor element to the circuit board by filling an underfill material between the circuit board and the semiconductor element. As a result, in order to allow the underfill material to fill in entirely between the circuit board and the semiconductor element, a flux washing process is needed, causing cost increase.

In order to solve such problems, recently, a method for electrically connecting only a predetermined conductive portion by heating and pressurizing with a film made of an anisotropic conductive adhesive agent containing conductive particles sandwiched between a protruding electrode on a semiconductor element and a connection terminal on the circuit board has been disclosed (see, for example, patent document 2).

Furthermore, an example is disclosed in which a thermosetting resin containing solder particles (conductive adhesive agent) is provided between an electrode terminal of a semiconductor element and a land of a circuit board, the resin is heated at the same time when the semiconductor element is pressurized so as to melt solder particles before the resin is cured (see, for example, patent document 3). Thus, electric connection between an electrode terminal of a semiconductor element and a land of a circuit board is carried out at the same time the semiconductor element and the circuit board are bonded to each other.

Furthermore, a method for forming a solder bump by light-exposing and developing a predetermined portion of a semiconductor element coated with solder particles photosensitive resin in which solder particles are contained in photosensitive resin is disclosed (see, for example, patent document 4). Thus, a solder bump having a structure in which solder particles are distributed in resin can be produced with high productivity. Furthermore, it discloses that a semiconductor element can be coupled to a wiring board with a solder bump by pressing the semiconductor element to the wiring board by a clamping circuit.

Furthermore, in general, in a connection method using a conductive bump having an elasticity capable of relieving the restriction of flatness of the mounting board, when the content of resin is increased in order to secure the elasticity, high conductivity cannot be obtained. Meanwhile, the mixing amount of the conductive filler is increased in order to secure high conductivity, the rubber elasticity of resin cannot be used sufficiently. As a result, a large load is required at the time of mounting. Furthermore, it is necessary to control height variation of the conductive bump with high accuracy. In order to solve such problems, a formation method for mixing needle-like conductive filler including whisker as a core material with resin having rubber elasticity and curing the mixture with heat or ultraviolet ray is disclosed (see, for example, patent document 5).

However, the conductive bump disclosed in each of the above-mentioned patent documents is formed of a conductive paste obtained by mixing conductive filler made of solder powder or powder of metal such as Ag, Cu and Au with thermosetting resin or photo-curing resin. Therefore, in order to reduce the connection resistance between electronic components to be connected, it is necessary to contain a certain amount or more of conductive fillers. As a result, when the amount of resin necessary to improve the mechanical bond strength between electrode terminals is reduced, the bond strength is reduced, which causes a problem of connection reliability. Furthermore, in the photosensitive resin, when a certain amount or more of conductive fillers is contained, light is shielded by them. Therefore, in particular, when a portion that is not reacted (not-cured) occurs around the electrode terminal, the bonding strength with respect to the electrode terminal cannot be secured.

[Patent document 1] Japanese Patent Application Unexamined Publication No. H7-74459
[Patent document 2] Japanese Patent Application Unexamined Publication No. 2000-332055
[Patent document 3] Japanese Patent Application Unexamined Publication No. 2004-260131
[Patent document 4] Japanese Patent Application Unexamined Publication No. H5-326524
[Patent document 5] Japanese Patent Application Unexamined Publication No. 2004-51755

SUMMARY OF THE INVENTION

A conductive bump of the present invention is formed on an electrode surface of an electronic component and composed of a plurality of photosensitive resin layers having different conductive filler contents.

Thus, adhesion of the conductive bump of the electronic component with respect to the electrode surface, high bond strength and high conductivity can be achieved.

Furthermore, a method for producing a conductive bump of the present invention includes steps of: immersing an electronic component in a low-density conductive filler resin paste filled in a container; forming a first layer including a low-density conductive filler resin layer on an electrode of the electronic component by irradiation with ultraviolet light or visible light from an opening portion of a photomask; immersing the electronic component in a high-density conductive filler resin paste; and forming a second layer including a high-density conductive filler resin layer on the first layer including the low-density conductive filler resin layer by irradiation with ultraviolet light or visible light from the opening portion of the photomask.

Thus, regardless of the shape of a semiconductor element or circuit board having warp or the like, it is possible to produce a conductive bump having excellent flatness in an arbitrary shape.

Furthermore, an electronic component mounted structure of the present invention has a configuration in which a semiconductor element having a plurality of electrode terminals and a circuit board having connection terminals disposed in positions facing the electrode terminals are connected to each other via the conductive bump provided on the electrode terminal or the connection terminal.

Thus, it is possible to realize an electronic component mounted structure having high bond strength and low connection resistance in which a semiconductor element and a circuit board with high flatness are not needed.

REFERENCE MARKS IN THE DRAWINGS 1, 81 electronic component
11, 44, 54, 91 semiconductor element
12, 22, 32, 45, 55, 92 electrode terminal
13, 47, 57, 83, 93 conductive bump
13a, 23a, 32a, 47a, 57a, 83a, 93a first layer (low-density conductive filler resin layer)
13b, 23b, 33b, 47b, 57b, 83b, 93b second layer (high-density conductive filler resin layer)
41, 51, 61 container
41a, 51a bottom surface
43, 53 low-density paste (low-density conductive filler resin paste)
46, 56 photomask (liquid crystal panel)
46a, 56a first opening portion
46b, 56b second opening portion
46c, 56c third opening portion
46d, 56d fourth opening portion
46e fifth opening portion
46f sixth opening portion
47$b_1$, 57$b_1$ first-stage layer
47$b_2$, 57$b_2$ second-stage layer
47$b_3$, 57$b_3$ third-stage layer
47$b_4$ fourth-stage layer
47$b_5$ fifth-stage layer
48, 58 high-density paste (high-density conductive filler resin paste)
82 electrode
94 circuit board
95 connection terminal
96 insulating sealing resin
100 electronic component mounted structure

DETAILED DESCRIPTION OF THE PREFERRED EMBODIMENT

Hereinafter, exemplary embodiments of the present invention are described with reference to drawings. The same reference numerals are given to the same configurations in the following exemplary embodiments and in each drawing.

First Exemplary Embodiment

Hereinafter, a structure of a conductive bump in accordance with a first exemplary embodiment of the present invention is described with reference to FIG. 1. Hereinafter, an example in which a semiconductor element is used as electronic component 1 and a conductive bump is formed on the semiconductor element is described. However, the same is true in the case in which a circuit board is used. Furthermore, an electrode of the electronic component is expressed by using an electrode terminal for the semiconductor element and a connection terminal for the circuit board.

Figure 1:
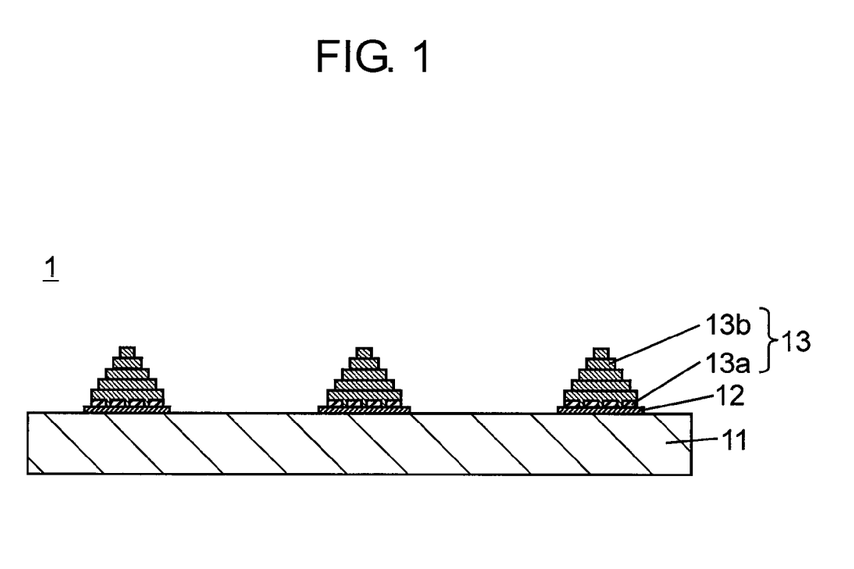
FIG. 1 is a sectional view illustrating a structure of a conductive bump in accordance with a first exemplary embodiment of the present invention.

FIG. 1 is a sectional view illustrating a structure of a conductive bump in accordance with the first exemplary embodiment of the present invention.

As shown in FIG. 1, conductive bump 13 is provided on 100 μm×100 μm electrode terminals 12 disposed on an area, for example, with a pitch of 150 μm and with 900 pins on semiconductor element 11 including a semiconductor memory such as ROM and RAM having an external size of, for example, 8 mm×8 mm. Conductive bump 13 is composed of a plurality of photosensitive resin layers, that is, first layer 13a including a low-density conductive filler resin layer and one or more second layers 13b including a high-density conductive filler resin layer disposed on first layer 13a. First layer 13a includes photosensitive resin including, for example, a photosensitive/thermoplastic acrylic oligomer, acrylic monomer, an initiator, a coupling agent, an adhesion-imparting agent, a reactive diluent, a solvent, or the like, which contains not less than 50 wt % and less than 80 wt % of 3 μm-spherical-shaped Ag particles as conductive filler. Furthermore, second layer 13b includes the above-mentioned photosensitive resin, which contains not less than 80 wt % and not more than 95 wt % of 3 μm-spherical-shaped Ag particles as conductive filler. At this time, first layer 13a is formed in, for example, a mesh shape in which a part of electrode terminal 12 is exposed as mentioned below in detail, and second layer 13b is brought into contact with the exposed surface. At this time, it is preferable that the thickness of each layer is not less than 5 μm with considering the size of the conductive filler.

Herein, the density denotes an amount of conductive filler with respect to resin. A low density and a high density denote a relative amount in a plurality of photosensitive resin layers forming a conductive bump.

In FIG. 1, a case in which five layers of high-density conductive filler resin layers (hereinafter, also referred to as "second layers") 13b are formed is described as an example. However, the number of layers is not necessarily limited to this example. For example, arbitrary number of layers may be formed according to the arrangement density, shape, area, and the like, of electrode terminal 12 and according to necessary aspect ratio.

Furthermore, in FIG. 1, a case in which low-density conductive filler resin layer (hereinafter, also referred to as "first layer") 13a is patterned in which at least a part of the upper surface of electrode terminal 12 is exposed is described as an example. However, the structure is not necessarily limited to this example. For example, when the electric resistance of the first layer is low, the entire surface of electrode terminal 12 may be covered with first layer 13*a*.

As mentioned above, according to conductive bump 13 of this exemplary embodiment, by reducing the density of the conductive filler of the first layer and increasing the content of the resin material as an adhesive component, the adhesion between the first layer of the conductive bump and electrode terminal 12 can be enhanced. For example, shear strength per bump is not less than 10 gf. Then, second layer 13*b* whose conductivity is enhanced by mixing the conductive filler with a high density is laminated on the upper surface of first layer 13*a*, so that connection resistance can be reduced. For example, connection resistance per bump is not more than 200 mΩ. As a result, it is possible to realize a conductive bump overcoming conflicting problems of a conventional conductive bump: improvement in mechanical adhesion strength and reduction of connection resistance. Furthermore, for example, by bonding semiconductor element 11 to a circuit board and the like via conductive bump 13, it is possible to realize an electronic component mounted structure having high mechanical strength between the electrode terminal and the connection terminal and having small connection resistance.

Herein, as semiconductor element 11, functional elements including a high-density integrated circuit element such as an LSI chip and a mass storage element such as a memory are used. At this time, electrode terminal 12 of semiconductor element 11 is formed by forming 0.1 μm to 0.3 μm Ni barrier layer (not shown) on, for example, an Al electrode that is an opening from which a part of wiring (not shown), patterned so that an area bump can be disposed, is exposed. Metal such as Au and Cu can be appropriately used for a material of electrode terminal 12, and metal such as Ti, Cr and W can be appropriately used as a barrier layer.

Furthermore, as a conductive filler mixed in low-density conductive filler resin layer 13*a* and high-density conductive filler resin layer 13*b*, in addition to the above-mentioned powders of metal such as Ag, Au, Cu, Ni, Pt, and the like, a conductive filler containing at least one solder alloy selected from an Sn—Ag—In alloy, an Sn—Pb alloy, an Sn—Ag alloy, an Sn—Ag—Bi alloy, an Sn—Ag—Bi—Cu alloy, an Sn—Ag—In—Bi alloy, a Zn—In alloy, an Ag—Sn—Cu alloy, an Sn—Zn—Bi alloy, an In—Sn alloy, an In—Bi—Sn alloy and an Sn—Bi alloy may be used.

Thus, since the conductive filler is formed of solder alloy particles having a low melting point, the photosensitive resin is not so much deteriorated by a heating temperature when the electronic component mounted structure is formed. Furthermore, since connection can be carried out by fusing a part of solder alloy particles to each other and atoms in the electrode terminal on the mount board disperse in the solder alloy particles, the connection resistance can be reduced.

Furthermore, as the photosensitive resin, in addition to photosensitive epoxy resin mentioned above, photosensitive resin including at least one of photosensitive polyimide resin, photosensitive acrylic resin, and thiol-ene resin may be used. Thus, for example, by using a stereo-lithography method, conductive bump 13 having any arbitrary fine shapes can be formed efficiently.

Furthermore, although not shown in FIG. 1, in the photosensitive resin that forms first layer 13*a* or second layer 13*b*, particles of metal such as Au, Cu, Pt or Ag, which have a scale shape with an average particle diameter of not more than 5 μm or a spherical shape with an average particle diameter of several nm to several hundred nm may be contained. In this case, the contact area is increased by fine metal particles having small specific resistance, and thereby the connection resistance between electrode terminal 12 and conductive bump 13 or the specific resistance of conductive bump 13 can be further reduced.

This exemplary embodiment describes an example in which conductive bump 13 is provided on electrode terminal 12 of semiconductor element 11. However, the configuration is not necessarily limited to this example. For example, conductive bump 13 may be provided on connection terminals of a circuit board such as a glass-epoxy board, an aramid board, a polyimide board or a ceramic board and the like. In this case, the same effect can be obtained.

Furthermore, this exemplary embodiment describes an example in which the shape of low-density conductive filler resin layer 13*a* as a first layer of conductive bump 13 has a mesh-shaped pattern. However, the shape is not necessarily limited to this example. For example, first layer 13*a* may be formed on electrode terminal 12 in various shapes as described with reference to FIGS. 2A to 2C.

Figure 2A:
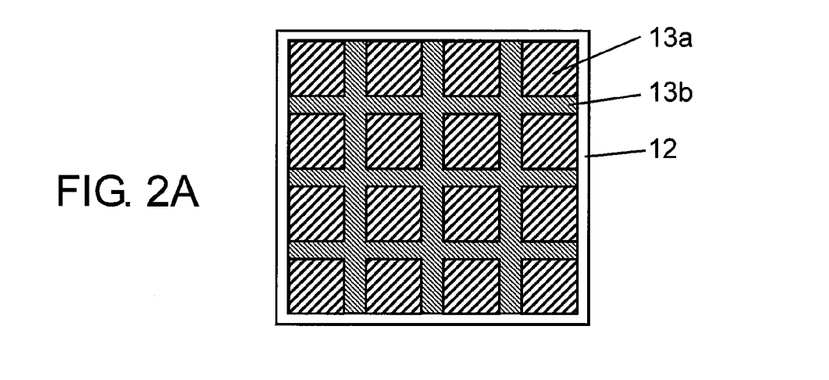
FIG. 2A is a plan view illustrating another example 1 of a pattern shape of a first layer of the conductive bump in accordance with the first exemplary embodiment of the present invention.
Figure 2B:
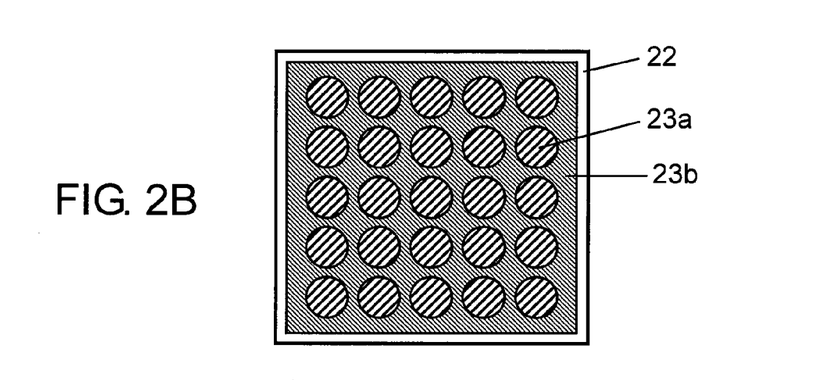
FIG. 2B is a plan view illustrating another example 2 of a pattern shape of the first layer of the conductive bump in accordance with the first exemplary embodiment of the present invention.
Figure 2C:
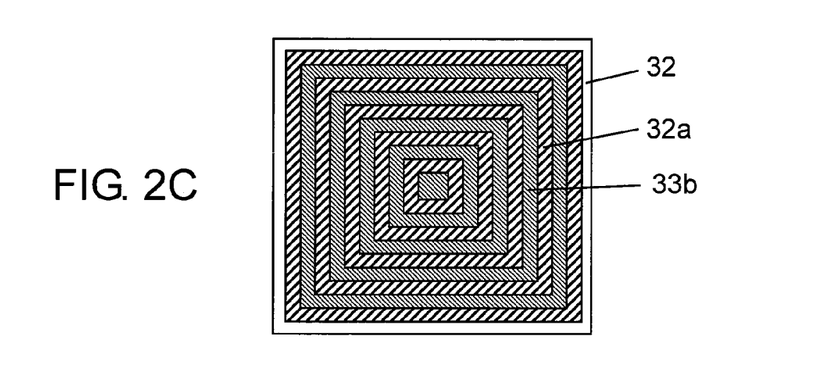
FIG. 2C is a plan view illustrating another example 3 of a pattern shape of the first layer of the conductive bump in accordance with the first exemplary embodiment of the present invention.

FIGS. 2A to 2C are plan views illustrating other examples of pattern shapes of the first layer of the conductive bump in accordance with the first exemplary embodiment of the present invention. Herein, FIGS. 2A to 2C are views taken on a plane of the first layer of the conductive bump.

FIG. 2A is a plan view illustrating another example 1 of the first layer of the conductive bump in accordance with this exemplary embodiment. That is to say, FIG. 2A shows first layer 13*a* formed in a lattice pattern on the surface of electrode terminal 12. At this time, when first layer 13*a* is formed, a surface of the electrode terminal 12 in a position other than the lattice pattern is exposed. Then, when second layer 13*b* of the high-density conductive filler resin layer is formed on the upper surface of first layer 13*a*, the exposed surface of electrode terminal 12 is filled with second layer 13*b*. Then, electrode terminal 12 and second layer 13*b* are brought into close contact with each other.

Thus, electrode terminal 12 is held by first layer 13*a* formed in a lattice pattern with high mechanical bond strength and connected with low connection resistance by second layer 13*b* filled in the surface of electrode terminal 12 in a position other than lattice pattern.

FIG. 2B is a plan view illustrating another example 2 of the first layer of the conductive bump in accordance with this exemplary embodiment. That is to say, FIG. 2B shows first layer 23*a* formed in circular block array. At this time, when electrode terminal 22 is exposed in gaps between the circular blocks and second layer 23*b* is formed on the upper surface of first layer 23*a*, second layer 23*b* is filled in the exposed surface.

Furthermore, FIG. 2C is a plan view illustrating another example 3 of the first layer of the conductive bump in accordance with this exemplary embodiment. FIG. 13C shows first layer 32*a* formed in concentric polygonal shape on the surface of electrode terminal 32. At this time, electrode terminal 32 in a position surrounded by concentric polygonal shaped first layers 32*a* is exposed. When second layer 33*b* is formed on first layer 32*a*, second layer 33*b* is filled in the exposed surface. Note here that a concentric polygonal shape may be a concentric circular shape.

Note here that in the examples mentioned above, the arrangement of the first layer and the second layer is not necessarily limited to those shown in FIGS. 2A to 2C. The pattern of the first layer may be replaced with that of the second layer. Furthermore, examples in which square or circle having the same dimensions are used as the shape of each pattern are described. However, the shapes and dimensions are not necessarily limited to these examples, and different shapes and dimensions may be employed. Furthermore, in the another example 3, an example in which the concentric polygonal shapes of first layer 32a and second layer 33b are arranged at equal intervals is described. However, the arrangement is not necessarily limited to this example, and they may be arranged in the different width or intervals.

Hereinafter, an outline of a method for producing a conductive bump in accordance with the first exemplary embodiment of the present invention is described with reference to FIG. 3. As mentioned above, an example in which an electronic component is a semiconductor element is described.

Figure 3:
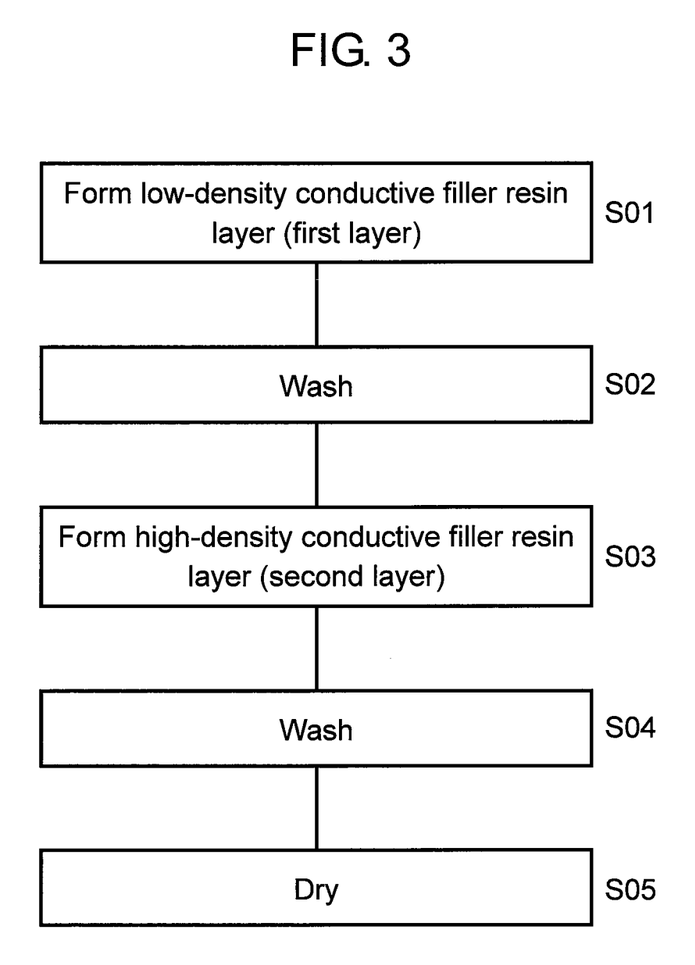
FIG. 3 is a flowchart illustrating a method for producing the conductive bump in accordance with the first exemplary embodiment of the present invention.

FIG. 3 is a flowchart illustrating a method for producing a conductive bump in accordance with the first exemplary embodiment of the present invention.

Firstly, a low-density conductive filler resin layer (first layer) is formed on an electrode terminal of a semiconductor element by using, for example, a stereo-lithography method (step S01). Note here that this forming method is not particularly limited. A first layer may be formed of a low-density conductive filler resin paste coated on the upper surface of the semiconductor element by using a photolithography method, a printing method, or the like.

Next, the semiconductor element is washed to remove unexposed low-density conductive filler resin paste of the first layer (step S02).

Next, the semiconductor element is immersed in a container filled with a high-density conductive filler resin paste. For example, a liquid crystal mask is used as a photomask and a second layer is formed on the electrode terminal of the semiconductor element by a stereo-lithography method via an opening portion of the photomask (step S03). At this time, the second layers are formed in a laminated structure, for example, by stepwise moving the semiconductor element upward or downward, or by consequently moving the semiconductor element.

Next, after the second layers are formed, the semiconductor element is washed (step S04) and dried (step S05). From the above-mentioned steps, a conductive bump that is excellent in mechanical bonding strength and electrical connection property can be obtained.

Hereinafter, a method for producing a conductive bump by using a stereo-lithography method in accordance with the first exemplary embodiment of the present invention is described in detail with reference to drawings. Also herein, an example in which a semiconductor element is used as an electronic component is described.

FIGS. 4A to 4C and FIGS. 5A to 5C are sectional views illustrating a method for producing a conductive bump in accordance with the first exemplary embodiment of the present invention.

Figure 4A:
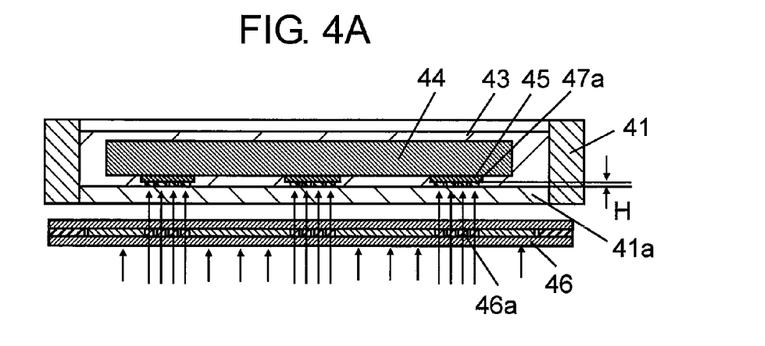
FIG. 4A is a sectional view illustrating a method for producing the conductive bump in accordance with the first exemplary embodiment of the present invention.

Firstly, as shown in FIG. 4A, container 41 is filled with low-density conductive filler resin paste 43 (hereinafter, referred to as "low-density paste") including, for example, photosensitive epoxy resin as a resin component, which contains conductive filler (not shown) such as 50 wt. % Sn-3.0 Ag-0.5 Cu solder alloy particles (melting point: 220° C.) having a particle diameter of, for example, 1 μm to 5 μm.

Then, electrode terminal 45 of semiconductor element 44 disposed on a stage (not shown) is immersed in low-density paste 43 in a state in which electrode terminal 45 faces bottom surface 41a of container 41 with a predetermined interval of H (for example, 2 μm to 5 μm).

At this time, for bottom surface 41a of container 41, an inorganic material such as quartz or an organic material such as polyethylene terephthalate and acrylic material, which transmits ultraviolet light or visible light, is used. Note here that in order to improve a mold releasing property, silicone oil, a silicone-based or fluorine-based mold release agent may be coated.

Note here that an example in which the content of the conductive filler contained in low-density paste 43 is about 50 wt. % is described. However, the content is not necessarily limited to this example. It is preferable that the content is, for example, not less than 40 wt. % and less than 70 wt. %. When the content is less than 40 wt. %, the electric resistance of the first layer of the conductive bump is increased. When the content is not less than 70 wt. %, the adhesion with respect to electrode terminal 45 is lowered. At this time, in low-density paste 43, a reactive diluent, a photoinitiator, an oligomer, a monomer, a dispersing agent, a solvent, or the like, is mixed if necessary.

Thereafter, in the above-mentioned state, low-density paste 43 in a predetermined region corresponding to electrode terminal 45 of semiconductor element 44 is irradiated with ultraviolet light or visible light and exposed to light by using a liquid crystal panel as photomask (hereinafter, which is also referred to as "liquid crystal panel") 46. Note here that the liquid crystal panel is formed, for example, by sandwiching a transmission type liquid crystal layer, in which liquid crystal cells are arranged two-dimensionally, between transparent substrates.

At this time, low-density paste 43 is exposed to light as follows. A driving signal voltage is applied to a predetermined liquid crystal cell of liquid crystal panel 46 to control an opening portion formed in a predetermined shape and in a predetermined position so as to form first opening portion 46a. Low-density paste 43 is irradiated with ultraviolet light or visible light via first opening portion 46a.

By the above-mentioned step, first layer 47a is formed on electrode terminal 45 with height (thickness) of H. Then, semiconductor element 44 is taken out from container 41 of low-density paste 43 and washed.

Figure 4B:
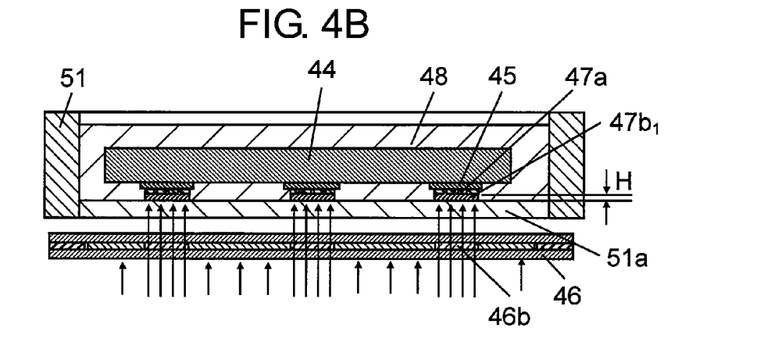
FIG. 4B is a sectional view illustrating the method for producing the conductive bump in accordance with the first exemplary embodiment of the present invention.

Next, as shown in FIG. 4B, container 51 is filled with high-density conductive filler resin paste 48 (hereinafter, referred to as "high-density paste") including photosensitive epoxy resin as a resin component, which contains conductive filler, for example, 85 wt. % Sn-3.0 Ag-0.5 Cu solder alloy particles.

Then, first layer 47a formed on electrode terminal 45 of semiconductor element 44 disposed on a stage (not shown) is immersed in high-density paste 48 in a state in which first layer 47a faces bottom surface 51a of container 51 with a predetermined interval of H (for example, 5 μm to 10 μm).

At this time, similar to container 41, for bottom surface 51a of container 51, an inorganic material such as quartz and an organic material such as polyethylene terephthalate and acrylic material, which transmits ultraviolet light or visible light, is used.

Note here that an example in which as container 51, a container that is different from container 41 is used is described. However, container 41 may be used and low-density paste 43 may be replaced with high-density paste 48.

Furthermore, in the above description, an example in which the conductive filler content in high-density paste 48 is about 85 wt. % is described. However, the content is not necessarily limited to this example. For example, the content may be, for example, in the range from 70 wt. % to 95 wt. %. In particular, it is preferably that the content is in the range from 75 wt. % to 90 wt. %. When the content is less than 70 wt. %, a conductive bump cannot have sufficient conductivity and when the content is more than 95 wt. %, the viscosity is increased, thus lowering the property as a paste. At this time, in high-density paste 48, similar to low-density paste 43, a reactive diluent, a photoinitiator, an oligomer, a monomer, a dispersing agent, a solvent, or the like, is mixed.

Thereafter, in the above-mentioned state, high-density paste 48 in a predetermined region of first layer 47a is irradiated with light having a predetermined wavelength such as ultraviolet light or visible light and exposed to light via second opening portion 46b, which is smaller than first opening portion 46a, of liquid crystal panel 46.

By the above-mentioned step, first-stage layer $47b_1$ of the second layer including the high-density conductive filler resin layer is formed with height (thickness) of H (for example, 5 μm to 10 μm).

Figure 4C:
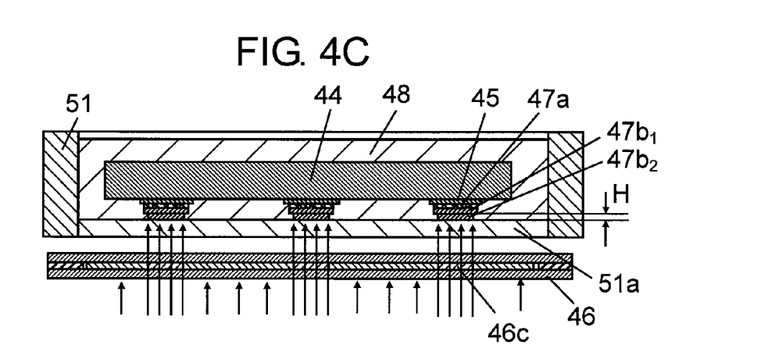
FIG. 4C is a sectional view illustrating the method for producing the conductive bump in accordance with the first exemplary embodiment of the present invention.

Next, as shown in FIG. 4C, semiconductor element 44 immersed in high-density paste 48 is moved upward so that the surface of first-stage layer $47b_1$ of the second layer faces bottom surface 51a of container 51 with a predetermined interval of H (for example, 5 μm to 10 μm). Then, similar to FIG. 4B, a driving signal voltage is applied to a predetermined liquid crystal cell of liquid crystal panel 46 so as to expose high-density paste 48 to light via third opening portion 46c thus forming second-stage layer $47b_2$ of the second layer including the high-density conductive filler resin layer.

Figure 5A:
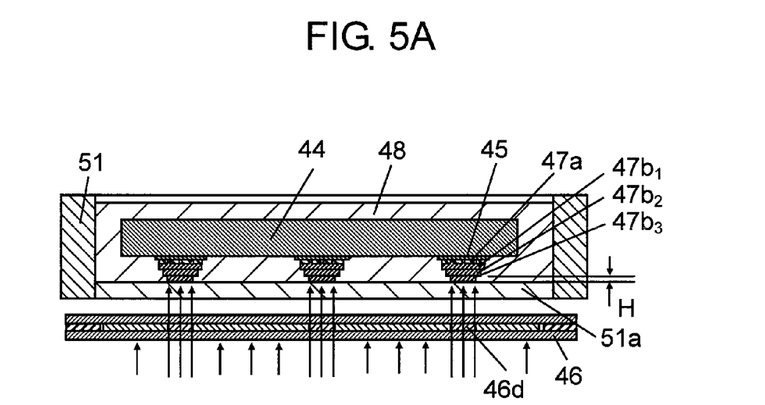
FIG. 5A is a sectional view illustrating the method for producing the conductive bump in accordance with the first exemplary embodiment of the present invention.
Figure 5B:
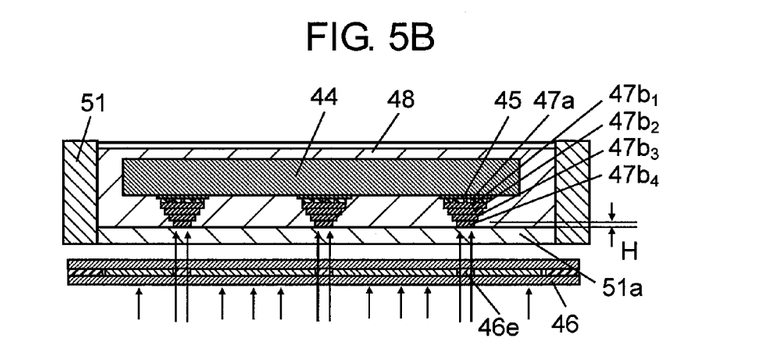
FIG. 5B is a sectional view illustrating the method for producing the conductive bump in accordance with the first exemplary embodiment of the present invention.
Figure 5C:
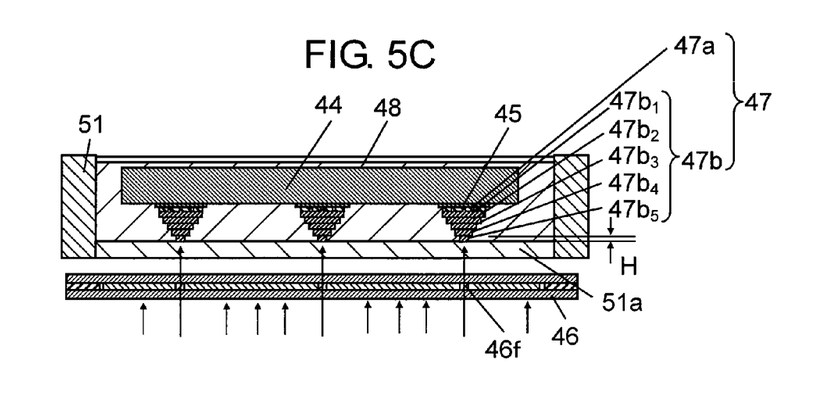
FIG. 5C is a sectional view illustrating the method for producing the conductive bump in accordance with the first exemplary embodiment of the present invention.

Next, as shown in FIGS. 5A to 5C, by the method similar to that in FIG. 4C, semiconductor element 44 is exposed to light while semiconductor element 44 is lifted sequentially in high-density paste 48, and an opening portion of liquid crystal panel 46 is changed sequentially from fourth opening portion 46d, fifth opening portion 46e, to sixth opening portion 46f. Thus, third-stage layer $47b_3$, fourth-stage layer $47b_4$, and fifth-stage layer $47b_5$ of the second layer are laminated. In this case, since the method can be carried out by the same method as that described in FIG. 4C except for the control of the opening portion of liquid crystal panel 46, detailed description is omitted herein.

Next, in the formation of the high-density conductive filler resin layer, semiconductor element 44 formed on electrode terminal 45 is taken out from container 51, and an unexposed portion of high-density paste 48 is removed, and then semiconductor element 44 is washed and dried.

From the above-mentioned steps, conductive bump 47 composed of first layer 47a including one layer of low-density conductive filler resin layer and second layer 47b including five layers of high-density conductive filler resin layers is produced.

According to the producing method of this exemplary embodiment, by using a liquid crystal panel as photomask 46, a versatile conductive bump can be freely produced on an electronic component in which the shape, position and number of electrode terminals 45 are different by changing the shape and area of an opening portion without exchanging photomask 46.

Furthermore, in an opening portion of photomask 46, since gray tone is used in the vicinity of the periphery, it is possible to reduce surplus growth curing of conductive paste by scattered light by using display gradation (for example, 256-gradation) of liquid crystal. As a result, it is possible to sharpen the edge of the conductive bump, which can correspond to narrow pitch easily.

Furthermore, low-density paste 43 or high-density paste 48 are not exposed to the air because they are photo-cured in a state in which they are sandwiched between semiconductor element 44 and bottom surfaces 41a, 51a of containers 41, 51. Therefore, it is also possible to use radical-curable photosensitive resin that is susceptible to oxygen inhibition.

This exemplary embodiment describes an example in which a conductive bump is formed by using a photomask having different opening portions from the first to sixth opening portions. However, the configuration is not necessarily limited to this example. For example, the opening portion may have the same shape, or the shape of the opening may be changed sequentially while exposure to light is carried out. Thus, a conductive bump having arbitrary shapes can be formed.

Second Exemplary Embodiment

Hereinafter, a method for producing a conductive bump in accordance with a second exemplary embodiment of the present invention is described with reference to drawings. The same reference numerals are given to the same components.

FIGS. 6A to 6D are sectional views illustrating a method for producing a conductive bump in accordance with the second exemplary embodiment of the present invention. As shown in FIGS. 6A to 6D, the second exemplary embodiment is different from the first exemplary embodiment in that a conductive bump is produced while a semiconductor element is submerged in a conductive paste.

Figure 6A:
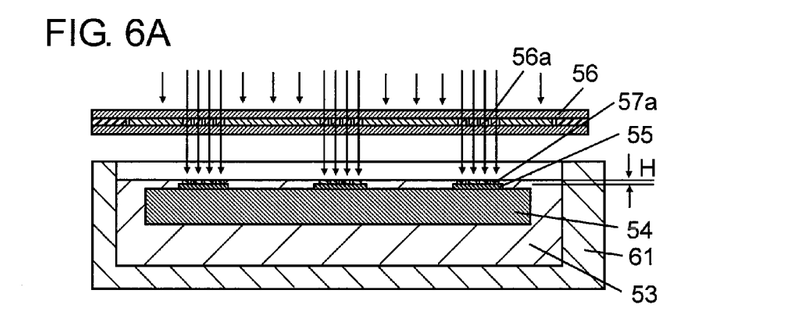
FIG. 6A is a sectional view illustrating a method for producing the conductive bump in accordance with a second exemplary embodiment of the present invention.

Firstly, as shown in FIG. 6A, container 61 is filled with low-density conductive filler resin paste 53 (hereinafter, referred to as "low-density paste") including 70 parts by weight of conductive filler, for example, Ag particles (average particle diameter: 0.2 μm to 3 μm) and 30 parts by weight of, for example, photosensitive resin (acrylate-based resin) as a resin component.

Then, electrode terminal 55 of semiconductor element 54 disposed on a stage (not shown) is immersed in low-density paste 53 to the position with a predetermined interval of H (for example, 1 μm to 5 μm) from the liquid surface of low-density paste 53.

Next, similar to the first exemplary embodiment, irradiation with ultraviolet light or visible light and exposure to light are carried out via first opening portion 56a formed as an opening portion of photomask 56 made of a liquid crystal panel (hereinafter, also referred to as "liquid crystal panel" 56), so that first layer 57a including a low-density conductive filler resin layer is formed on electrode terminal 55.

In the above-mentioned step, first layer 57a including a low-density conductive filler resin layer is formed with height (thickness) of H. Thereafter, low-density paste 53 of semiconductor element 54 is taken out from container 61 and washed.

Figure 6B:
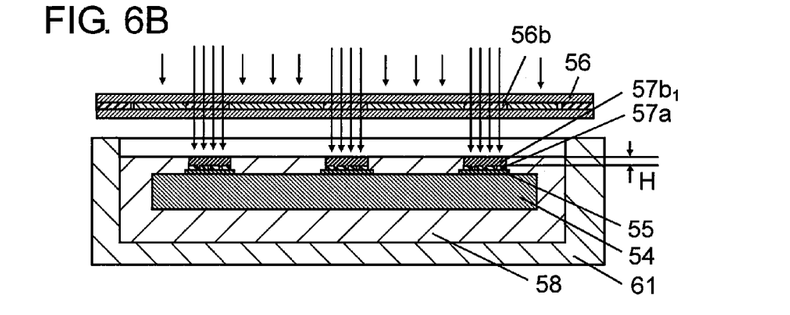
FIG. 6B is a sectional view illustrating the method for producing the conductive bump in accordance with the second exemplary embodiment of the present invention.

Next, as shown in FIG. 6B, container 61 is filled with high-density conductive filler resin paste 58 (hereinafter, referred to as "high-density paste") including 90 parts by weight of conductive filler, for example, Ag particles (average particle diameter: 0.2 μm to 3 μm) and 10 parts by weight of, for example, photosensitive resin (acrylate-based resin) as a resin component.

Then, semiconductor element 54 disposed on a stage (not shown) is immersed in high-density paste 58 with a predetermined interval of H (for example, 1 μm to 5 μm) provided between the surface of first layer 57a formed on electrode terminal 55 and the liquid surface of the high-density paste.

Then, in the above-mentioned state, the high-density paste is irradiated with ultraviolet light or visible light and exposed to light via second opening portion 56b formed in photomask 56 made of a liquid crystal panel. In the above-mentioned steps, first-stage layer $57b_1$ of the second layer including a high-density conductive filler layer is formed with height (thickness) of H (for example, 1 μm to 5 μm) on the surface of first layer 57a.

Figure 6C:
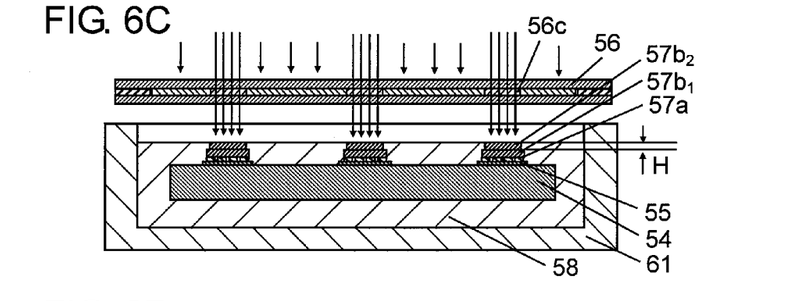
FIG. 6C is a sectional view illustrating the method for producing the conductive bump in accordance with the second exemplary embodiment of the present invention.

Next, as shown in FIG. 6C, semiconductor element 54 immersed in high-density paste 58 is further submerged, and the surface of first-stage layer 57$b_1$ of the second layer is allowed to face a liquid surface of high-density paste 58 with a predetermined interval of H (for example, 1 μm to 5 μm) provided therebetween. Then, by adding a driving signal voltage to a predetermined liquid crystal cell of liquid crystal panel 56, high-density paste 58 is exposed to light via third opening portion 56c similar to FIG. 6B. Thus, second-stage layer 57$b_2$ of the second layer including a high-density conductive filler resin layer is formed.

Figure 6D:
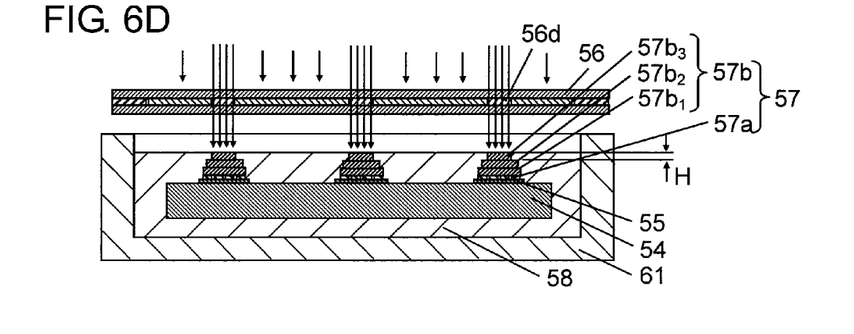
FIG. 6D is a sectional view illustrating the method for producing the conductive bump in accordance with the second exemplary embodiment of the present invention.

Next, as shown in FIG. 6D, semiconductor element 54 is furthermore submerged in high-density paste 58, and the surface of second-stage layer 57$b_2$ of the second layer is allowed to face a liquid surface of high-density paste 58 with a predetermined interval of H (for example, 1 μm to 5 μm) provided therebetween. Then, high-density paste 58 is exposed to light via fourth opening portion 56d of liquid crystal panel 56. Thus, third-stage layer 57$b_3$ of second layer is formed by the same method as in FIG. 6C.

Next, although not shown, semiconductor element 54 having second layer 57b including the high-density conductive filler resin layer on electrode terminal 55 is taken out from container 61, and an unexposed portion of high-density paste 58 is removed, and then semiconductor element 54 is washed and dried.

From the above-mentioned steps, conductive bump 57 composed of first layer 57a including one layer of low-density conductive filler resin layer and second layer 57b including three layers of high-density conductive filler resin layers is produced.

This exemplary embodiment describes an example in which the number of the stage-layers of second layer 57b of the high-density conductive filler resin layer forming conductive bump 57 is three. However, the number of the stage-layers is not necessarily limited to this example. For example, similar to the case of the first exemplary embodiment, the number of the stage-layers may be five or arbitrary number according to the property or shape of the conductive bump.

Hereinafter, one example of a conductive bump produced by this exemplary embodiment is shown.

Figure 7A:
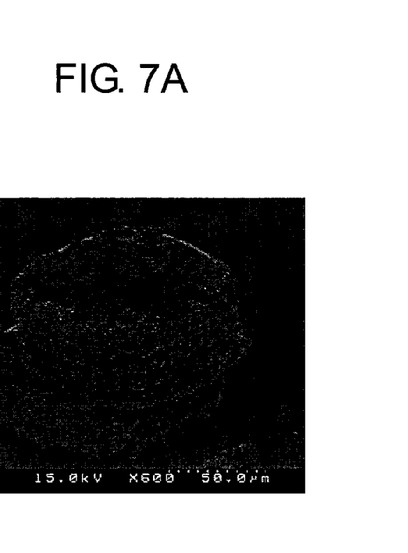
FIG. 7A is a SEM photograph showing an example of a conductive bump produced by using an exemplary embodiment of the present invention.
Figure 7B:
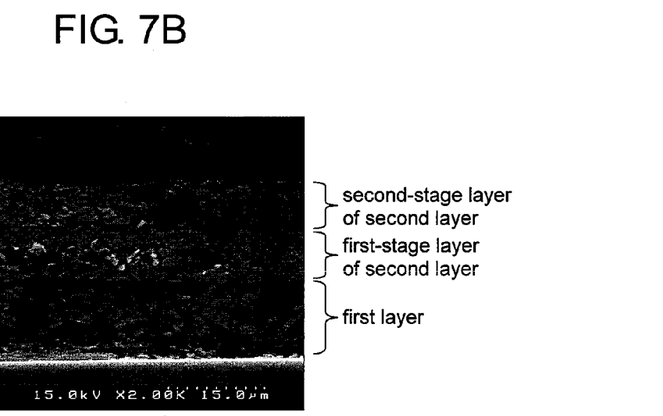
FIG. 7B is a SEM photograph showing an example of a conductive bump produced by using an exemplary embodiment of the present invention.

FIG. 7A is a SEM photograph showing a conductive bump. FIG. 7B is a SEM photograph showing a cross-section in which a second layer including a high-density filler resin layer is formed on a first layer including a low-density conductive filler resin layer. FIGS. 7A and 7B show that the conductive filler is contained in the second layer with higher density than in the first layer.

Each of the exemplary embodiments of the present invention describes an example in which solder alloy particles or Ag particles are used as the conductive filler used in the low-density conductive filler resin paste and the high-density conductive filler resin paste. However, the conductive filler is not necessarily limited to the examples. For example, particles of metals such as Au, Pt, Ni and Cu may be used.

Figure 8:
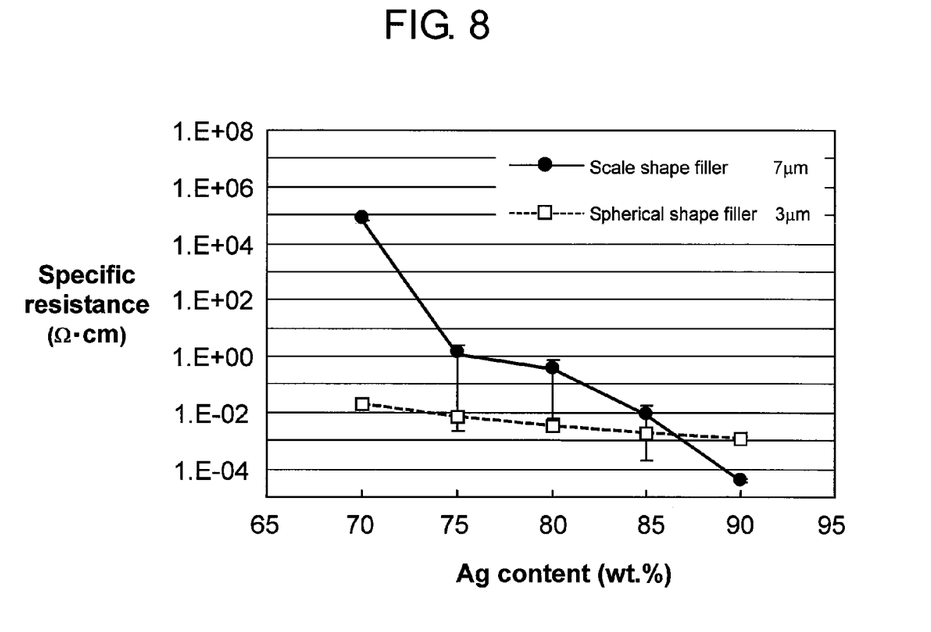
FIG. 8 is a view showing a relation between the conductive filler content and the specific resistance when a particle shape of the conductive filler is used as a parameter in accordance with an exemplary embodiment of the present invention.

Furthermore, FIG. 8 shows the relation between the conductive filler content and specific resistance when the shape of the conductive filler (Ag) is used as a parameter. From the relation, as the shape of the particle of the conductive filler, it is preferable that a spherical-shaped particle is used for the low-density conductive filler resin paste and a scale-shaped particle is used for the high-density conductive filler resin paste. The reason thereof is follows. As shown in FIG. 8, when the spherical-shaped particle is used, even when the content of resin component is as large as 30 wt. %, the increase in the specific resistance is small. In the case where the scale-shaped particle is used, when the content is made to be not less than 86 wt. %, higher conductivity can be obtained as compared with the case where the spherical-shaped particles are used. Meanwhile, when the scale-shaped particle is used, it is not preferable that the resin component is as large as 30 wt. % because the contact area between conductive fillers is reduced by the orientation of the particles, and because an area shielded from light by the conductive filler is changed and the effect there of is large. As a result, variation in curing of resin component is increased and the specific resistance is increased, thereby increasing connection resistance of the conductive bump.

Third Exemplary Embodiment

Hereinafter, a conductive bump in accordance with a third exemplary embodiment of the present invention is described with reference to FIG. 9.

Figure 9:
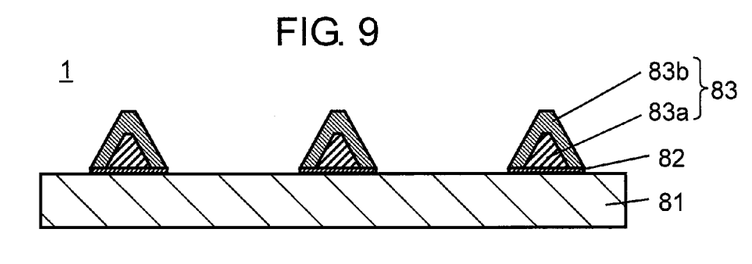
FIG. 9 is a schematic sectional view illustrating a structure of a conductive bump in accordance with a third exemplary embodiment of the present invention.

FIG. 9 is a schematic sectional view illustrating a structure of the conductive bump in accordance with the third exemplary embodiment of the present invention. As shown in FIG. 9, the third exemplary embodiment is different from the first exemplary embodiment in that entire first layer 83a of a low-density conductive filler resin layer, which constitutes conductive bump 83 formed on the surface of electrode 82 of electronic component 81, is covered with second layer 83b of a high-density conductive filler resin layer.

Figure 10A:
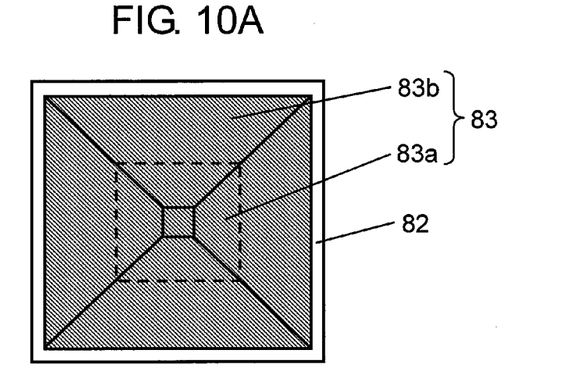
FIG. 10A is a schematic plan view showing a conductive bump in accordance with the third exemplary embodiment of the present invention.
Figure 10B:
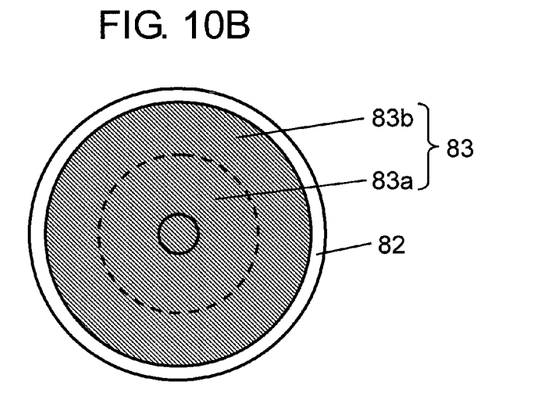
FIG. 10B is a schematic plan view showing a conductive bump in accordance with the third exemplary embodiment of the present invention.

FIGS. 10A and 10B are schematic plan views showing conductive bump 83 shown in FIG. 9. FIG. 10A shows a quadrangular pyramid shape and FIG. 10B shows a cone shape.

As shown in FIG. 9, in the center portion of the surface of electrode 82, first layer 83a including a low-density conductive filler resin layer having a large amount of resin component and having enhanced mechanical bonding strength is formed. Second layer 83b including a high-density conductive filler resin layer having a large amount of conductive filler and having high conductivity is formed so as to cover the outer peripheral portion of first layer 83a.

Herein, conductive bump 83 in this exemplary embodiment can be produced by basically the same producing method as those in the first and second exemplary embodiments, for example, by a stereo-lithography method. That is to say, firstly, on electrode 82, for example, a quadrangular pyramid-shaped first layer 83a including a low-density conductive filler resin layer is formed. Next, second layer 83b including a high-density conductive filler resin layer is formed so as to cover the entire first layer 83a. Thus, it is possible to realize conductive bump 83 overcoming conflicting problems: improvement in mechanical adhesion strength and reduction of connection resistance.

Each of the above-mentioned exemplary embodiments describes an example in which a photomask made of a liquid crystal panel is used. However, the photomask is not necessarily limited to this example. For example, a conductive bump may be formed by exchanging a photomask having certain shapes of the opening portion or a photomask having different shapes of the opening portions.

Furthermore, each of the above-mentioned exemplary embodiments describes an example in which exposure to light is carried out by using a photomask collectively. However, the configuration is not necessarily limited to this example. For example, a predetermined region may be exposed to light by laser beam scanning, thus forming a conductive bump sequentially.

Fourth Exemplary Embodiment

Hereinafter, an electronic component mounted structure in accordance with a fourth exemplary embodiment of the present invention is described with reference to FIGS. 11A and 11B.

Figure 11A:
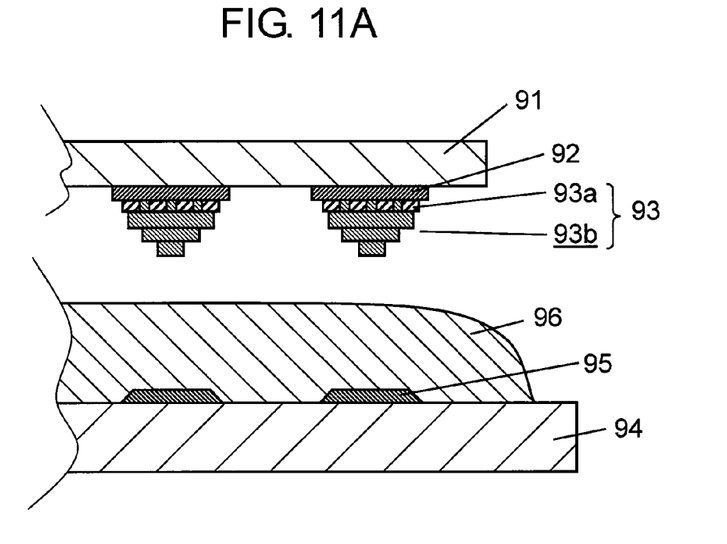
FIG. 11A is a partial schematic sectional view illustrating an electronic component mounted structure in accordance with a fourth exemplary embodiment of the present invention.
Figure 11B:
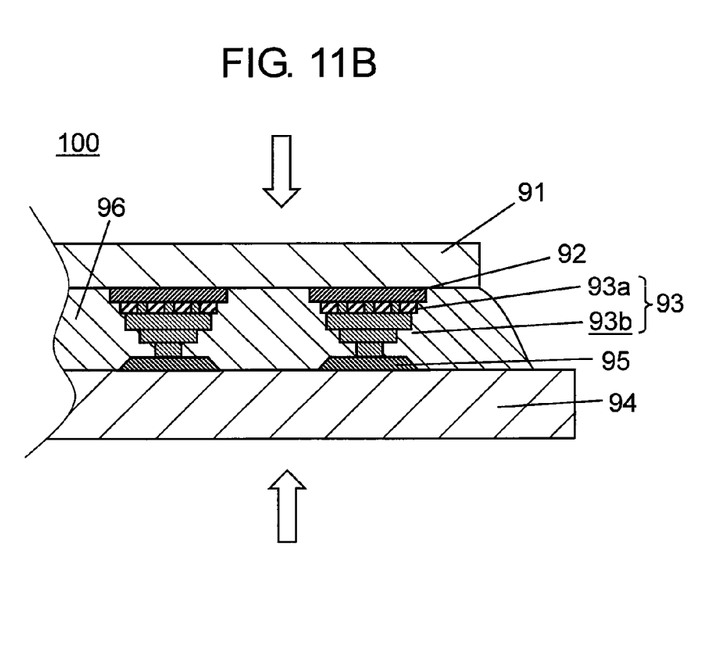
FIG. 11B is a partial schematic sectional view illustrating an electronic component mounted structure in accordance with the fourth exemplary embodiment of the present invention.

FIGS. 11A and 11B are partial schematic sectional views illustrating an electronic component mounted structure in accordance with the fourth exemplary embodiment of the present invention. That is to say, an electrode terminal of a semiconductor element or a connection terminal of a circuit board is connected via a conductive bump produced in each of the above-mentioned exemplary embodiments, thus producing electronic component mounted structure 100.

Firstly, as shown in FIG. 11A, semiconductor element 91, which has conductive bump 93 composed of first layer 93*a* including a low-density conductive filler resin layer produced in each of the exemplary embodiments and second layer 93*b* including a high-density conductive filler resin layer formed on the first layer 93*a* on electrode terminal 92, is disposed in a position corresponding to a position of connection terminal 95 of circuit board 94. At this time, insulating sealing resin 96 is coated on the circuit board 94.

Next, as shown in FIG. 11B, semiconductor element 91 and circuit board 94 are pressurized and heated via insulating sealing resin 96 coated on circuit board 94. Thus, semiconductor element 91 and circuit board 94 are pressed and attached to each other.

At this time, high-density conductive filler resin layer 93*b* at the tip end of conductive bump 93 is pressed into contact with connection terminal 95 and electrically connected thereto while insulating sealing resin 96 existing on connection terminal 95 of circuit 94 is removed, and adhesively fixed by curing and shrinkage of insulating sealing resin 96.

According to this exemplary embodiment, a semiconductor element and a circuit board are connected to each other with a conductive bump composed of a low-density conductive filler resin layer that is excellent in adhesion with respect to electrode terminal and a high-density conductive filler resin layer that is excellent in conductivity and that has small specific resistance. Consequently, it is possible to obtain electronic component mounted structure 100 that is excellent in the electric connection property and the mechanical bond strength.

INDUSTRIAL APPLICABILITY

According to the present invention, a conductive bump that is excellent in adhesion with respect to an electrode surface and has small connection resistance can be formed with a narrow pitch. Therefore, the conductive bump is useful in the field of mounting of electronic components in portable telephones, portable digital devices, and digital home appliances, which are becoming smaller and thinner.

The invention claimed is:

1. A conductive bump formed on an electrode surface of an electronic component, the conductive bump comprising a plurality of photosensitive resin layers including a conductive filler,
   wherein the conductive filler content among the plurality of photosensitive resin layers is different,
   in a first layer on the electrode surface, two regions mutually different in the conductive filler content are located at different positions within a plane of the first layer, and
   the first layer includes at least one of the plurality of photosensitive resin layers.

2. The conductive bump of claim 1,
   wherein the electronic component is a circuit board or a semiconductor element.

3. The conductive bump of claim 1,
   wherein the conductive filler comprises at least one of:
   at least one solder alloy selected from an Sn—Ag—In alloy, an Sn—Pb alloy, an Sn—Ag alloy, an Sn—Ag—Bi alloy, an Sn—Ag—Bi—Cu alloy, an Sn—Ag—In—Bi alloy, a Zn—In alloy, an Ag—Sn—Cu alloy, an Sn—Zn—Bi alloy, an In—Sn alloy, an In—Bi—Sn alloy, and an Sn—Bi alloy, or
   at least one powder of metal selected from Ag, Au, Cu, and Pt.

4. The conductive bump of claim 1,
   wherein the photosensitive resin layer is made of a resin material including at least one of photosensitive epoxy resin, photosensitive polyimide resin and photosensitive acrylic resin.

5. The conductive bump of claim 1, wherein the conductive filler content is a weight percentage of the conductive filler.

6. The conductive bump of claim 1,
   wherein the plurality of photosensitive resin layers include a low-density conductive filler resin layer small in the conductive filler content and a high-density conductive filler resin layer large in the conductive filler content.

7. The conductive bump of claim 6,
   wherein the low-density conductive filler resin layer is formed in contact with the electrode surface.

8. The conductive bump of claim 7,
   wherein the low-density conductive filler resin layer has a shape that is patterned so that a part of the electrode surface is exposed.

9. An electronic component mounted structure, comprising:
   a semiconductor element having a plurality of electrode terminals; and
   a circuit board having connection terminals in positions facing the electrode terminals; and
   wherein the semiconductor element and the circuit board are connected to each other via a conductive bump of claim 1 provided on the electrode terminal or the connection terminal.

* * * * *